United States Patent
Hamilton et al.

(10) Patent No.: US 6,956,768 B2
(45) Date of Patent: Oct. 18, 2005

(54) METHOD OF PROGRAMMING DUAL CELL MEMORY DEVICE TO STORE MULTIPLE DATA STATES PER CELL

(75) Inventors: Darlene G. Hamilton, San Jose, CA (US); Kulachet Tanpairoj, Palo Alto, CA (US); Edward Hsia, Saratoga, CA (US); Yi He, Freemont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 256 days.

(21) Appl. No.: 10/413,800

(22) Filed: Apr. 15, 2003

(65) Prior Publication Data
US 2004/0208057 A1 Oct. 21, 2004

(51) Int. Cl.[7] .............................................. G11C 16/04
(52) U.S. Cl. ........................... 365/185.03; 365/185.18; 365/185.21
(58) Field of Search ........................ 365/185.03, 185.18, 365/185.21, 185.02

(56) References Cited

U.S. PATENT DOCUMENTS

| | | | |
|---|---|---|---|
| 5,163,021 A | 11/1992 | Mehrotra et al. | |
| 6,137,718 A | 10/2000 | Reisinger | |
| 6,215,702 B1 | 4/2001 | Derhacobian et al. | |
| 6,246,611 B1 | 6/2001 | Pawletko et al. | |
| 6,295,228 B1 | 9/2001 | Pawletko et al. | |
| 6,307,784 B1 | 10/2001 | Hamilton et al. | |
| 6,309,926 B1 | 10/2001 | Bell et al. | |
| 6,331,951 B1 | 12/2001 | Bautista, Jr. et al. | |
| 6,344,994 B1 | 2/2002 | Hamilton et al. | |
| 6,356,482 B1 | 3/2002 | Derhacobian et al. | |
| 6,370,061 B1 | 4/2002 | Yachareni et al. | |
| 6,400,624 B1 | 6/2002 | Parker et al. | |
| 6,442,074 B1 | 8/2002 | Hamilton et al. | |
| 6,456,533 B1 | 9/2002 | Hamilton et al. | |
| 6,529,405 B2 * | 3/2003 | Chang ................... | 365/185.03 |
| 6,538,922 B1 | 3/2003 | Khalid et al. | |
| 6,577,532 B1 * | 6/2003 | Chevallier ............. | 365/185.03 |
| 6,744,675 B1 * | 6/2004 | Zheng et al. .......... | 365/185.18 |
| 2002/0137286 A1 | 9/2002 | Gonzalez et al. | |
| 2002/0159293 A1 | 10/2002 | Hamilton et al. | |
| 2003/0080370 A1 * | 5/2003 | Harari et al. ................ | 257/314 |

FOREIGN PATENT DOCUMENTS

| | | |
|---|---|---|
| EP | 1 223 586 A1 | 7/2002 |
| EP | 1 271 550 A2 | 1/2003 |
| WO | WO 03/038907 A1 | 5/2003 |

OTHER PUBLICATIONS

*Intel StrataFlash Memory Technology*, Intel Corporation, AP–677, Application Note, Dec. 1998, Order No. 297859–002.

* cited by examiner

*Primary Examiner*—Huan Hoang
(74) *Attorney, Agent, or Firm*—Renner, Otto, Boisselle & Sklar, LLP

(57) ABSTRACT

A method of programming a multi-level, dual cell memory device. The method includes independently programming a first charge storing cell and a second charge storing cell to respective data states, the data states selected from a blank program level or one of a plurality of charged program levels. Also disclosed is a method of reading the multi-level, dual cell memory device using a plurality of reference currents.

20 Claims, 3 Drawing Sheets

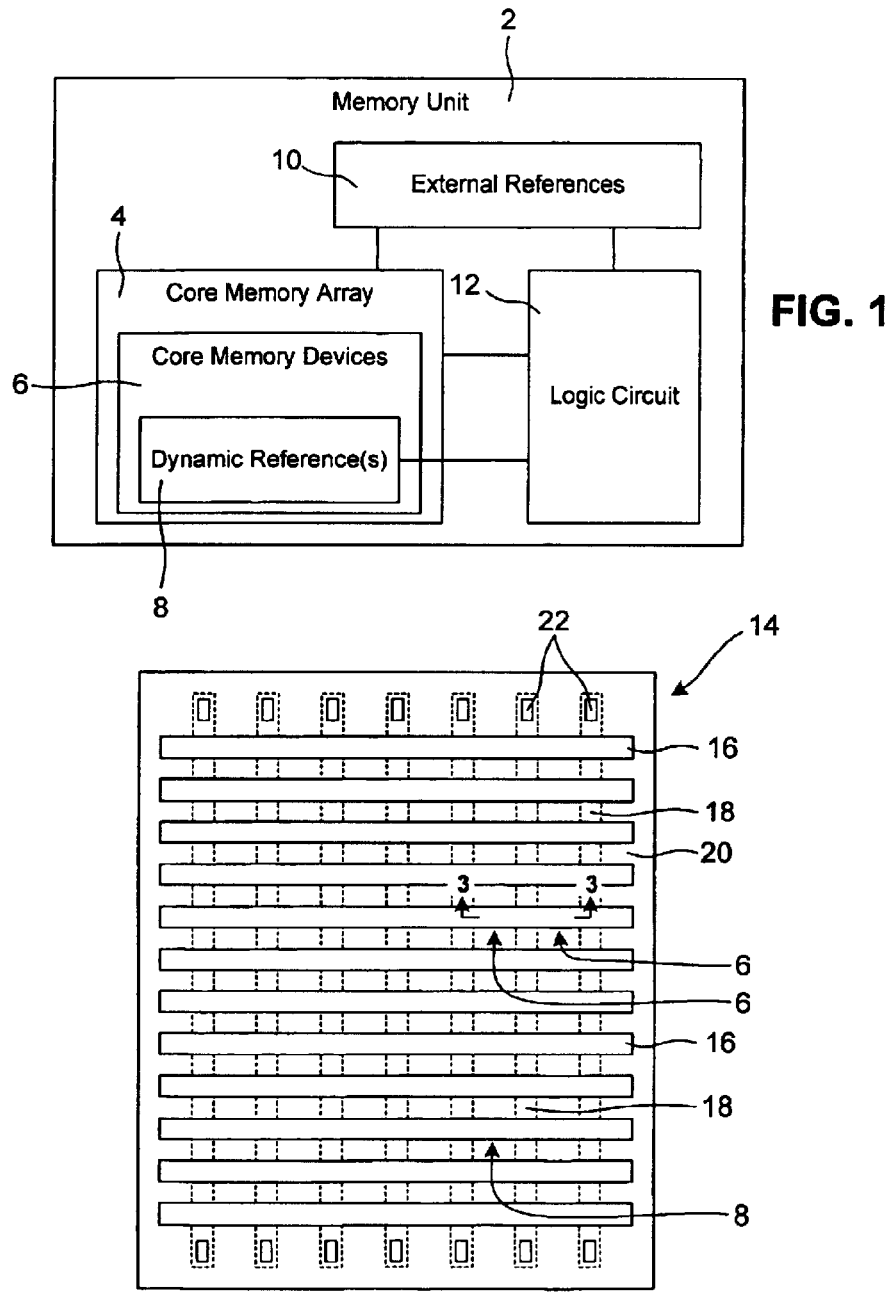

METHOD OF PROGRAMMING DUAL CELL MEMORY DEVICE TO STORE MULTIPLE DATA STATES PER CELL

TECHNICAL FIELD

The present invention relates generally to the field of non-volatile memory devices and, more particularly, to a method of storing multiple data states in each charge storing region of a dual cell charge trapping dielectric flash memory device.

BACKGROUND

A pervasive trend in modern integrated circuit manufacture is to increase the amount of data stored per unit area on an integrated circuit memory unit, such as a flash memory unit. Memory units often include a relatively large number of core memory devices (sometimes referred to as core memory cells). For instance, a conventional dual cell memory device, such as a charge trapping dielectric flash memory device, can store data in a "double-bit" arrangement. That is, one bit (i.e., a binary data value have two states, such as a logical one and a logical zero) can be stored using a memory cell on a first "side" of the memory device and a second bit can be stored using a complimentary memory cell on a second "side" of the memory device.

Programming of such a memory device can be accomplished, for example, by hot electron injection. Hot electron injection involves "pulsing" the device by applying appropriate voltage potentials to each of a gate and a drain of the memory device for a specified duration. During the programming pulse, the source is typically grounded. Reading of the memory device can be accomplished by applying an appropriate voltage to each of the gate, source and/or drain and comparing the drain to source current (as an indication of device threshold voltage) against a reference value to thereby determine if each memory cell is in a programmed or an unprogrammed state.

Even though conventional charge trapping dielectric flash memory devices are capable of storing two single-bit binary data values per memory device, there is an ever increasing demand to store even more data per unit area of a memory core.

SUMMARY OF THE INVENTION

According to one aspect of the invention, the invention is directed to a method of programming a charge trapping dielectric memory device having a first charge storing cell adjacent a first conductive region and a second charge storing cell adjacent a second conductive region. The method includes programming the first charge storing cell to store a first amount of charge, the first amount of charge corresponding to a first cell data state selected from a blank program level or one of a plurality of charged program levels; and programming the second charge storing cell to store a second amount of charge, the second amount of charge corresponding to a second cell data state selected from the blank program level or one of the plurality of charged program levels.

According to another aspect of the invention, the invention is directed a method of programming and subsequently reading a charge trapping dielectric memory device having a first charge storing cell adjacent a first conductive region and a second charge storing cell adjacent a second conductive region. The method includes programming the memory device, including programming the first charge storing cell to store a first amount of charge, the first amount of charge corresponding to a first cell data state selected from a blank program level or one of a plurality of charged program levels; and programming the second charge storing cell to store a second amount of charge, the second amount of charge corresponding to a second cell data state selected from the blank program level or one of the plurality of charged program levels. The method also includes reading one of the charge storing cells by comparing a first conductive region to second conductive region current against a plurality of reference currents to determine the data state to which the read charge storing cell is programmed.

BRIEF DESCRIPTION OF DRAWINGS

These and further features of the present invention will be apparent with reference to the following description and drawings, wherein:

FIG. 1 is a schematic block diagram of an exemplary memory unit having a plurality of core memory devices to which a method of programming in accordance with the present invention can be applied;

FIG. 2 is a schematic block diagram of a portion of a core memory array from the memory unit that can include the core memory devices;

DISCLOSURE OF INVENTION

Figure 3:
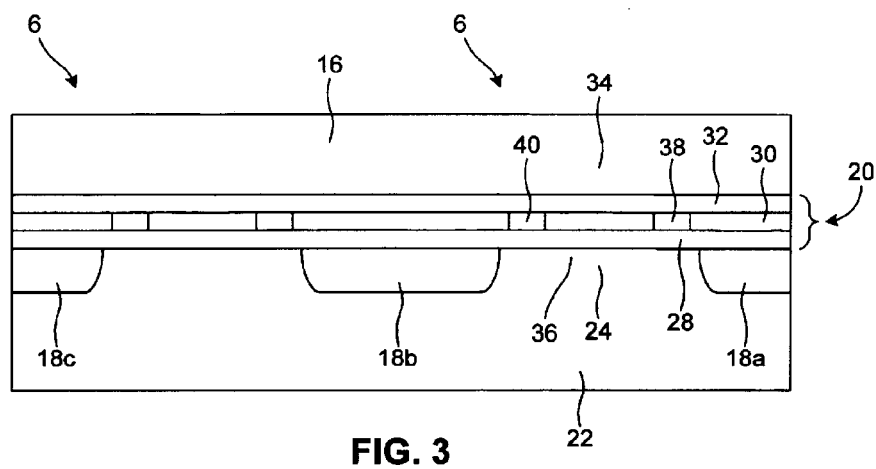
FIG. 3 is a schematic cross-section illustration of exemplary core memory devices from the core memory array taken along the line 3—3 of FIG. 2.

In the detailed description that follows, like components have been given the same reference numerals, regardless of whether they are shown in different embodiments of the present invention. To illustrate the present invention in a clear and concise manner, the drawings may not necessarily be to scale and certain features may be shown in somewhat schematic form.

With reference to FIG. 1, shown is a schematic block diagram of an exemplary memory unit 2. The memory unit 2 can include a core memory array 4 containing a plurality of memory devices, such as dual cell, non-volatile, flash electrically erasable and programmable memory devices. For example, the memory devices can be charge trapping dielectric flash memory devices as will be discussed in greater detail below.

The memory devices of the core memory array 4 can include a plurality of core memory devices 6 and associated dynamic reference memory devices 8. In one embodiment, the array 4 can be arranged such that the dynamic reference memory devices 8 are formed within a matrix of the core memory devices 6.

Other memory devices, such as external references 10, can also form a part of the memory unit 2. The external reference 10 are separate from the core memory array 4 and can include, for example, erase verify reference cells, program verify reference cells and soft programming reference cells.

As one skilled in the art will appreciate, the core memory devices 6 can be used by a customer of the memory unit 2 to store information, such as data or executable code. The dynamic references 8 can be used to assist in reading the core memory devices 6. More specifically, the dynamic references 8 are used as indicators of the data level behavior of the core memory devices 6. Various operations of the memory unit 2, including, for example, programming, verifying, reading and erasing, can be controlled by a logic circuit 12.

With additional reference to FIG. 2, shown is a top view, schematic block diagram of a portion, or sector 14, of the core memory array 4 from the memory unit 2. The sector 14 can include core memory devices 6 and one or more dynamic reference devices 8. The sector 14 can include word lines 16 and bit lines 18 arranged with a dielectric stack 20 to operatively form the core memory devices 6 and the dynamic reference device(s) 8. Application of appropriate voltages to the word lines 16 and the bit lines 18 allows for the addressing of the memory devices 6, 8 of the sector 14 such that each memory device can be programmed, read, verified and/or erased. Bit line contacts 22 can be used to establish electrical connection to the bit lines 18 through the dielectric stack 20.

With additional reference to FIG. 3, a portion of the sector 14 is illustrated in cross-section to illustrate an exemplary arrangement of the memory devices of the core memory array 4. The cross-section of FIG. 3 shows two core memory devices 6. Each of the core memory devices 6, as well as the dynamic reference memory devices 8, can be implemented as a virtual ground, dual cell, non-volatile, flash electrically erasable and programmable memory devices. It should be understood that the illustrated memory devices 6 are shown for exemplary purposes and can be implemented with alternative structures (e.g., in stacked gate arrangement, in recessed gate arrangement, etc.). In addition, the relative positioning of the core memory devices 6 with respect to the dynamic reference 8 can be modified.

The exemplary memory devices 6 are implemented as a charge trapping dielectric type flash memory devices, each of which includes a pair of complimentary charge trapping regions that can be independently programmed and read.

For simplicity of the discussion herein, only the arrangement of one core memory device 6 will be described. However, the remaining core memory devices 6 and the dynamic reference memory devices 8 can have a corresponding structure and operation.

In the illustrated embodiment, the core memory device 6 includes a P-type semiconductor substrate 22. Within the substrate 22, the bit lines 18 are formed in a buried bit line format. The bit lines 18 (also referred to herein as conductive regions) can be formed by implanting N-type dopant into the substrate 22, or from a metal or metal containing compound (e.g., silicide bit lines 18). For each device 6, adjacent pair of bit lines 18 form conductive regions that function as a source and a drain during various programming and reading operations. For each device, a body 24 is disposed between the adjacent pairs of bit lines 18. Although not illustrated, a nitride layer can be formed over the bit lines 18 and P+ pocket implants can be added adjacent the bit lines 18.

Above the substrate 22 is the dielectric stack 20. The dielectric stack 20 includes a bottom dielectric layer 28 (also referred to as a tunneling dielectric layer) that is made from, for example, silicon oxide ($SiO_2$), other standard-K material (e.g., have a relative permittivity below ten) or a high-K material (e.g., have a relative permittivity, in one embodiment, above ten and, in one embodiment, above twenty).

Over the bottom dielectric layer 28 is a charge trapping layer (also referred to as a charge storing layer 30). The charge storing layer 30 can be made from, for example, a non-conductive material including silicon nitride ($Si_3N_4$) or other suitable material.

Over the charge storing layer 30 is another dielectric layer (also referred to as a top dielectric layer 32) made from a material such as, for example, silicon oxide, other standard-K material or a high-K material.

The word lines 16 are formed over the top dielectric layer 32. For each core memory device 6, one of the word lines 16 functions as a gate electrode 34. The word lines 16 can be formed from, for example, polycrystalline silicon. In alternative arrangements, the gate electrodes 34 can be formed from interconnected conductive islands or pads. A work function of the word line 16 and the dielectric stack 20 controls a channel 36 within the body 24, extending from one bit line 18 to an adjacent bit line 18.

As one skilled in the art will appreciate, modifications to the core memory devices 6 can be made. Such modifications can include changes to the physical arrangement of the core memory device 6, materials used, doping parameters and the like. However, the programming, verifying, reading and/or erasing techniques described herein can be used in conjunction with such a modified device.

The core memory devices 6 can be configured as a virtual ground devices. That is, during various operations of the memory devices 6 either of the bit lines 18 associated with the memory device 6 can function as a source of electrons or holes by respectively controlling the voltage potentials applied to the corresponding bit lines 18. In addition, the bit line 18, functioning as the source of electrons and/or holes can be grounded or can be connected to a bias potential.

As will become more apparent from the discussion below, within the charge storing layer 30, the core memory device 6 includes a first charge storing region (also referred to herein as a normal cell, a right-hand bit or a first charge storing cell 38) adjacent one of the conductive regions (e.g., the bit line identified as bit line 18a) and a second charge storing region (also referred to herein as a complimentary cell, a left-hand bit or a second charge storing cell 40) adjacent the other of the conductive regions (e.g., the bit line identified as bit line 18b).

In one embodiment, each charge storing cell 38, 40 can have multiple data states, such as four data states. The data states can represent a two bit binary word, such as a logical zero-zero, logical zero-one, logical one-zero and logical one-one. The logical one-one data state, for example, can be implemented by leaving the desired charge storing cell 38, 40 in an unprogrammed state or blank program level which will be referred to herein as "level 1". The other logical data states, for example, can be implemented by storing distinguishable amounts of charge in the desired charge storing cell 38, 40, which are also referred to as a charged states, programmed states, programmed levels or charged program levels. A lowest charged program level corresponding to the one-zero data state will be referred to herein as "level 2". A medium charged program level corresponding to the zero-one data state will be referred to herein as "level 3". A highest charged program level corresponding to the zero-zero data state will be referred to herein as "level 4".

In the illustrated embodiment, the memory device 6 is a structurally symmetrical device allowing for programming, verifying, reading and erasing of the first charge storing cell 38 and the second charge storing cell 40 by respectively switching the roles of the bit lines 18a and 18b (source and drain) during those operations. Therefore, the bit lines 18a, 18b will be referred to interchangeably by the terms source and drain, depending on the charge storing cell 38, 40 of interest.

Programming of the core memory device 6 in accordance with the techniques described herein can be referred to as "quad-bit" data storage. As used herein, the term "quad-bit" or "quad-bit data storage" refers to independently "programming" each charge storing cell 38, 40 with amount of charge selected from the four distinguishable amounts, including the blank program level and the three charged program levels. Therefore, in the quad-bit embodiment, each core memory device 6 (or "transistor") has sixteen data states (i.e., between the associated pair of charge storing cells 38, 40, there are sixteen permutations of the blank program level and the three charged program levels). In another embodiment there can be more than three charged program levels.

For purposes of the present disclosure, the programming technique to store charge with either of the charge storing cells 38, 40 involves hot electron injection, also referred to as channel hot electron injection (CHE). However, it should be appreciated that modifications to the programming techniques can be made to accommodate variations in the specific memory device used.

Using hot electron injection, the first charge storing cell 38 can be programmed to the charged program level by applying voltages to the bit line 18a (functioning as the drain) and to the word line 16 (functioning as the gate electrode 34). The other bit line 18b functions as the source (i.e., source of electrons) for the CHE programming of the charge storing cell 38. In one embodiment, a bias voltage potential is also applied to the source (rather than grounding or floating the source as found in conventional charge trapping dielectric flash memory devices). As a result of the application of a bias potential to the source during programming, greater control over electron injection can be accomplished, which leads to enhanced data retention capability of the memory device 6.

The voltages applied to the gate electrode 34, the source and the drain generate a vertical electric field through the dielectric layers 28, 32 and the charge storing layer 30 and a lateral electric field along the length of the channel 36 from the source to the drain. At a given threshold voltage, the channel 36 will invert such that electrons are drawn off the source and begin accelerating toward the drain. As the electrons move along the length of the channel 36, the electrons gain energy and upon attaining enough energy, the electrons are able to jump over the potential barrier of the bottom dielectric layer 28 and into the charge storing layer 30 where the electrons become trapped. The probability of electrons jumping the potential barrier is a maximum in the area of the charge storing cell 38 adjacent the drain (i.e., bit line 18a), where the electrons have gained the most energy. These accelerated electrons are termed hot electrons and once injected into the charge storing layer 30, stay in the charge storing cell 38 of the charge storing layer 30. The trapped electrons tend not to spread through the charge storing layer 30 due to this layer's low conductivity and low lateral electric field therein. Thus, the trapped charge remains localized in the charge trapping region of the charge storing cell 38 close to the adjacent bit line 18a.

The foregoing technique to program the first charge storing cell 38 can be used to program the second charge storing cell 40, but the functions of the bit lines 18a and 18b (i.e., source and drain) are reversed.

Reading of the cells 38, 40 of the core memory device 6 can be carried using, for example, a reverse read operation. For example, to read the first charge storing cell 38, a voltage can be applied to the conductive region opposite the first charge storing region 38 (i.e., bit line 18b, which is also referred to as the drain during read operations) and a voltage can be applied to the gate electrode 34. The conductive region adjacent the first charge storing region 38 (i.e., bit line 18a, which is also referred to as the source during read operations) can be grounded. To read the second charge storing cell 40, the roles of the bit lines 18a and 18b can be reversed. The read operation drain voltage functions to mask, or "cover up," charge stored by the "unread" charge storing cell 38, 40.

During the read operation, an amount of current drawn across the channel 36 can be used as an indication of core memory device 6 threshold voltage and can be compared against a reference current(s) (as indications of reference threshold voltages) to determine the data state of the "read" one of the charge storing cells 38, 40. Generation of the reference currents and comparison of the channel 36 current against the reference currents will be described in greater detail below.

Figure 4:
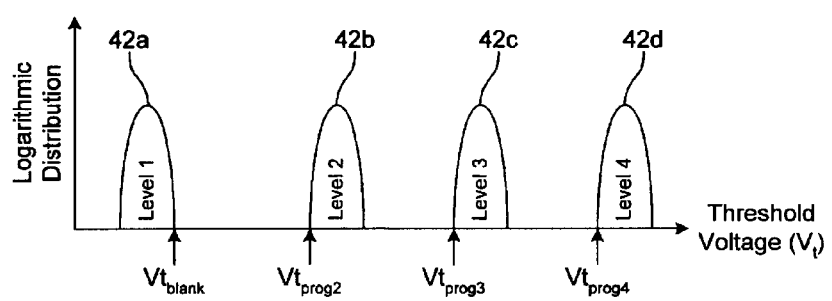
FIG. 4 is a population plot that includes relative program level threshold voltage distributions for multi-level cell (MLC) programming of a charge storing cell from the core memory device.

With additional reference to FIG. 4, shown is a population plot that includes relative threshold voltage (Vt) distributions 42 that are indicative of the data states for one of the charge storing cells 38, 40 of the core memory device 6. The blank state, or level 1, is represented by distribution 42a, level 2 is represented by distribution 42b, level 3 is represented by distribution 42c and level 4 is represented by distribution 42d.

Relative threshold voltage distributions for the data states of the other of the charge storing cells 38, 40 of the core memory device 6 would have similar appearance to those illustrated in FIG. 4. It is noted that the threshold voltage distributions 42 can have a tendency to shift upward or downward along the threshold voltage axis based on factors such as program/erase (P/E) cycling of the memory device 6 and complimentary bit disturb (CBD) (i.e., the effect of charge stored by one cell 38, 40 has on the programming and/or reading of the other cell 38, 40).

It is noted that the data state of each of the charge storing cells 38, 40 can be the same or different to take advantage of the asymmetrical data retention ability of charge trapping dielectric flash memory devices. The ability to store multiple charge amounts corresponding to multiple program levels (e.g., level 2 through level 4) in addition to a blank state (e.g., level 1) by one of the cells 38, 40 can be referred to as multi-level cell (MLC) data storage. As indicated, the asymmetrical, four level (or four data state) charge storing technique for each cell 38, 40 described herein can be referred to as "quad bit" data storage.

MLC programming in the virtual ground arrangement can be accomplished by associating each charged program level with specified program voltages, including a gate voltage ($V_g$), a source voltage ($V_s$) and a drain voltage ($V_d$). The varying $V_g$, $V_s$ and $V_d$ for each program level allows control over the amount of charge stored in the respective charge storing cells 38, 40. As a result, the threshold voltage (Vt) of the core memory device 6 during verify operations falls above a program-verify reference value corresponding to the target charged program level and/or during read operations, the Vt of the core memory device 6 falls with the predetermined threshold voltage distributions 42. Alternatively, the programming duration can be controlled to regulate the amount of the charge stored in the respective charge storing cell 38, 40. In yet another embodiment, the program voltages and the programming duration can be altered in conjunction with one another to achieve the desired charge amount in the target charge storing cell 38, 40.

In the virtual ground arrangement of the core memory device 6, a voltage bias (e.g., a voltage potential other than ground) can be applied to the source during programming. The source bias voltage, in combination with the voltage potentials applied to the gate electrode 34 and the drain, can be used to result in additional control over the programming of the core memory device 6.

With continuing reference to FIG. 4, the combination of program conditions are selected such that when the target charge storing cell 38, 40 is programmed to level 4, the amount of charged stored by the cell 38, 40 is higher than the amount of charge stored by the cell 38, 40 when the cell 38, 40 is programmed to level 3. In one embodiment, a minimum threshold voltage ($Vt_{prog4}$) of the level 4 distribution 42d is about one volt higher than a maximum threshold voltage of the level 3 distribution 42c. Similarly, the amount of charged stored by the cell 38, 40 programmed to level 3 is higher than the amount of charge stored by the cell 38, 40 when the cell 38, 40 is programmed to level 2. In one embodiment, a minimum threshold voltage ($Vt_{prog3}$) of the level 3 distribution 42c is about one volt higher than a maximum threshold voltage of the level 2 distribution 42b. Similarly, the amount of charged stored by the cell 38, 40 programmed to level 2 is higher than the amount of charge stored by the cell 38, 40 when the cell 38, 40 is programmed to level 1. In one embodiment, a minimum threshold voltage ($Vt_{prog2}$) of the level 2 distribution 42b is about 1.5 volts higher than a maximum threshold voltage of the level 1 distribution 42a, or the erase threshold voltage ($Vt_{blank}$).

After the core memory device 6 has been pulsed to inject charge into one of the charge storing cells 38, 40, a verify operation can be conducted to verify that the core memory device 6 was programmed to the desired charged program level 2–4. The verify operation can include comparing a drain to source current ($I_{ds}$) of the core memory device 6 (or $I_{core}$) that is generated when appropriate voltages are applied to the gate electrode 34, the source and/or the drain against a current generated by an external verify reference device corresponding to the desired charged program level 2–4. Accordingly, the external references 10 (FIG. 1) can include at least three fixed (e.g., statically charged) program verify references, each capable of providing a reference current corresponding to the charged program levels 2–4 (e.g., $I_{vref2}$ for verifying charge storage corresponding to level 2, $I_{vref3}$ for verifying charge storage corresponding to level 3, and $I_{vref4}$ for verifying charge storage corresponding to level 4. If the $I_{core}$ is greater than the $I_{vref}$ corresponding to the desired program level, then the logic circuit 12 can conclude that the target charge storing cell 38, 40 is appropriately charged and programming of a subsequent charge storing cell 38, 40 to be programmed can be commenced. If, however, the $I_{core}$ is less than the $I_{ref}$ corresponding to the desired program level, then the logic circuit 12 can conclude that the target charge storing cell 38, 40 is not charged to the desired program level and the target charge storing cell 38, 40 can be repulsed.

Reading of the charge storing cells 38, 40 can be carried out to account for the effect that the unread cell 38, 40 may have on the threshold voltage (as indicated by $I_{ds}$) of the core memory device 6 during reading of the read cell 38, 40. That is, any charge present in the other charge storing cell 38, 40 may impact (i.e., increase) the threshold voltage of the memory device 6. This phenomenon is know as complimentary bit disturb (CBD) and has been found to have a greater impact when the unread cell 38, 40 is programmed to a relatively high program level (e.g., level 3 or level 4, which are associated with greater stored charge amounts).

To counter CBD, each charge storing cell 38, 40 is read (or interrogated) in a separate "reverse" read operation. To read the interrogated cell 38, 40 about 3V to about 5V can be applied to the gate electrode 34 and about 1.4V to about 2V can be applied to the conductive region (i.e., bit line 18) adjacent the unread cell 38, 40 (this conductive region referred to as the drain during read operations). The conductive region (i.e., bit line 18) adjacent the read cell 38, 40 (this conductive region referred to as the source during read operations) can be grounded. The drain voltage creates a depletion region within the channel 32 under the unread cell 38, 40 to "cover-up" charge stored by the unread cell 38, 40.

The $I_{ds}$ of the core memory cell 6 (or $I_{core}$) is compared against currents from dynamic reference memory cells 8 to determine the data state of the interrogated cell 38, 40. As indicated, the dynamic references 8 can be implemented as dual cell memory devices having the same structure and operational characteristics as the core memory devices 6. In one embodiment, the dynamic references 8 form a part of the core memory array 4. Briefly, each charge storing cell of the dynamic references 8 can be programmed to store an amount of charge such that the dynamic references 8 are programmed with certain data state configurations that could be stored by the core memory devices 6. For example, one dynamic reference could be used to store a level 1 in one cell and a level 4 in the other cell.

Over time, the charge amount stored by the cells of the dynamic references 8 and other factors contributing to the threshold voltage of the dynamic references 8 may change. These changes cause a corresponding change in the threshold voltage of the dynamic references 8. The change in dynamic reference 8 threshold voltage can be used by the logic circuit 12 associated with the memory unit 2 to account for drift in threshold voltage of the remaining core memory devices 6, such as during reading of the core memory cells 6. The logic circuit 12 could also use the threshold voltage tracking of the dynamic references 8 to refresh or reprogram the core memory devices 6 and/or the dynamic reference memory devices 8 based on the change in dynamic reference 8 threshold voltage.

For simplicity of the discussion herein, a two digit value will be used to describe the data states stored by the respective cells 38, 40 of an interrogated core memory cell 6 or an interrogated dynamic reference 38, 40. The fist digit represents the data state of the read cell 38, 40 and the second digit represents the data state of the unread cell 38, 40. For example, if the read cell 38, 40 is programmed to level 3 and the unread cell is programmed to level 2, the interrogated memory device 6, 8 can be represented by the notation "32".

The drain to source current of the interrogated core memory cell 6 ($I_{core}$) can be compared against reference currents ($I_{ref}$) to determine the data state of the read cell 38, 40. The reference currents $I_{ref}$ can be derived from averaging the drain to source currents of selected pairs of dynamic references 8, the cells 38, 40 of which have been pre-programmed to store selected data states (as used herein, the term "averaging" can include any mathematical analysis or current/voltage comparisons in addition to deriving a mean value). Therefore, specific reference currents will be identified herein as $I_{ref-ab/nm}$ where the variables a and b respectively stand for the data states of the read cell 38, 40 and the unread cell 38, 40 of a first dynamic reference 8 from the averaged pair and the variables n and m respectively stand for the data states of the read cell 38, 40 and the unread cell 38, 40 of a second dynamic reference 8 from the averaged pair. If desired, the reference currents can alternatively be derived using more than two dynamic references 8. As should be appreciated, comparing $I_{core}$ and $I_{ref}$ is directly indicative of the threshold voltage of the core memory cell 6 relative to the various data states (e.g., level 1, level 2, level 3 and level 4).

Figure 5:
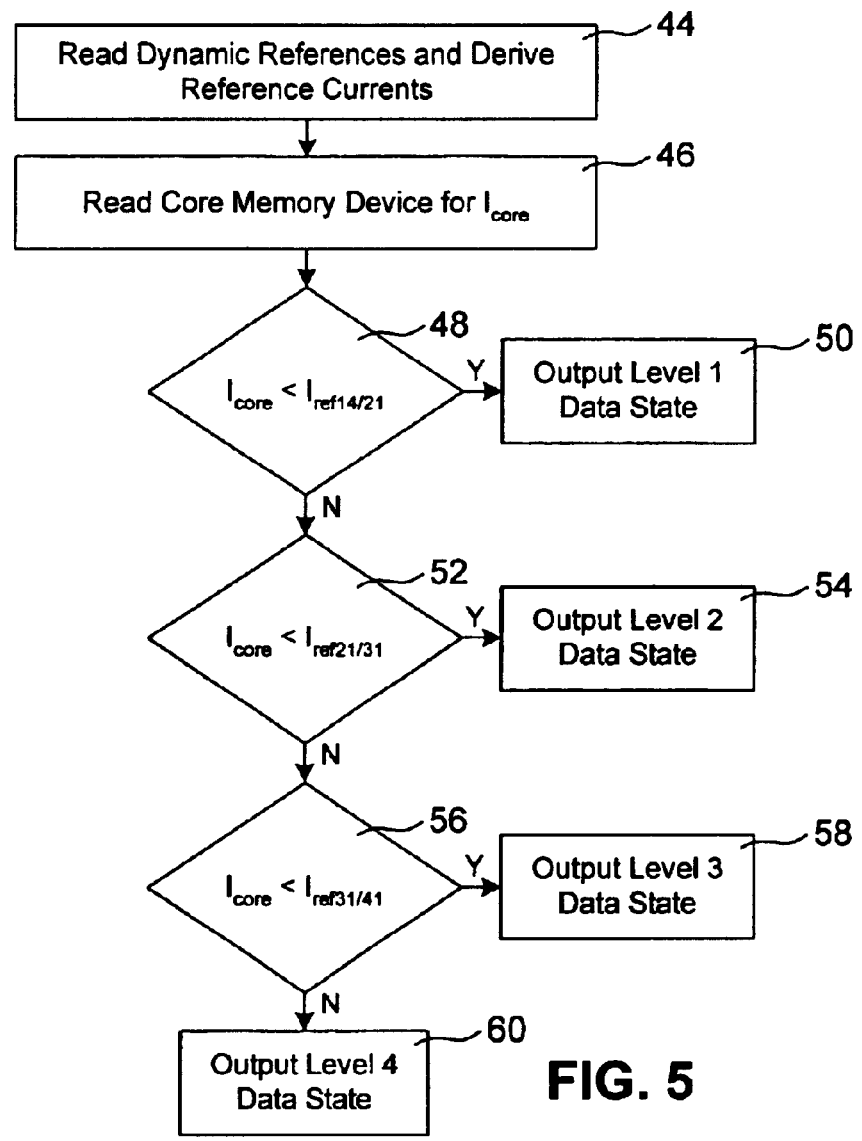
FIG. 5 is a flow diagram representing a method of reading a selected charge storing cell from the core memory device.

With additional reference to FIG. 5, a flow diagram representing one method of reading a selected cell 38, 40 of a core memory device 6 is illustrated. Although the flow diagram illustrates sequential comparison of the core device 6 current against the reference currents, the logic circuit 12 can be implemented to compare the core device 6 current against the various reference currents simultaneously and produce an appropriate output corresponding to the read data state. Such an implementation assists in increasing read speed of the memory unit. Accordingly, the logic circuit 12 can be implemented with, for example, a plurality of sense amplifiers for comparing currents and logic gates for outputting an appropriate binary word based on the current comparisons.

The method of reading can start in block 44 where the dynamic references 8 are read and the reference currents are generated. In one embodiment, the operations of block 44 can be carried out once for all cells 38, 40 of all core memory devices 6 to be read during the overall read operation of the memory unit 2. Thereafter, in block 46, the core memory device 6 can be interrogated to determine the core device 6 current for the cell 38, 40 being read.

Next, in block 48, the core device 6 current ($I_{core}$) can be compared against a first reference current ($I_{ref14/21}$). The first reference current can be derived from dynamic reference devices 8 to be indicative of whether the read cell 38, 40 of the core memory device 6 is in the blank data state (i.e., level 1) or a charged program level (i.e., level 2 or higher). The first reference current, in the illustrated embodiment, is derived by averaging a reference current from at least one dynamic reference indicative of the maximum possible complimentary bit disturb for a cell 38, 40 storing a blank data state and a reference current from at least one dynamic reference indicative of the minimum possible threshold voltage for a cell 38, 40 storing the lowest charged program level.

The maximum possible complimentary bit disturb for a cell 38, 40 storing a blank data state can be indicated by a dynamic reference device 8 for which the read cell 38, 40 is in a blank data state (e.g., level 1) and the unread cell 38, 40 is in the highest charged program level (e.g., for the quad bit arrangement, level 4). The minimum possible threshold voltage for a cell 38, 40 storing the lowest charged program level can be indicated by a dynamic reference device 8 for which the read cell 38, 40 stores charge corresponding to the lowest charged program level (e.g., level 2) and the unread cell 38, 40 is uncharged or in the blank data state (e.g., level 1). Hence, the first reference current is illustrated by the shorthand notation of $I_{ref14/21}$.

If $I_{core}$ is less than $I_{ref14/21}$, then a determination can be made that the read cell 38, 40 of the interrogated core memory device 6 is in the blank data state and, in block 50, an indication of this state can be output by the logic circuit 12, such as by outputting a binary word of "11".

If $I_{core}$ is greater than $I_{ref14/21}$, then a determination can be made that the read cell 38, 40 of the interrogated core memory device 6 is in a charged program state and the method can proceed to block 52 where $I_{core}$ can be compared against a second reference current ($I_{ref21/31}$). The second reference current can be derived from dynamic reference devices 8 to be indicative of whether the read cell 38, 40 of the core memory device 6 is in the lowest charged data state (e.g., level 2) or a higher charged program level (i.e., level 3 or higher). The second reference current, in the illustrated embodiment, is derived by averaging a reference current from at least one dynamic reference indicative of the minimum possible threshold voltage for a cell 38, 40 storing the lowest charged program level and the minimum possible threshold voltage for a cell 38, 40 storing the middle charged program level.

The minimum possible threshold voltage for a cell 38, 40 storing the lowest charged program level can be indicated by a dynamic reference device 8 for which the read cell 38, 40 stores charge corresponding to the lowest charged program (e.g., level 2) and the unread cell 38, 40 is uncharged or in the blank data state (e.g., level 1). The minimum possible threshold voltage for a cell 38, 40 storing the middle charged program level can be indicated by a dynamic reference device 8 for which the read cell 38, 40 stores charge corresponding to the middle charged program level (e.g., level 3) and the unread cell 38, 40 is uncharged or in the blank data state (e.g., level 1). Hence, the first reference current is illustrated by the shorthand notation of $I_{ref21/31}$.

If $I_{core}$ is less than $I_{ref21/31}$, then a determination can be made that the read cell 38, 40 of the interrogated core memory device 6 is in the lowest charged program state (e.g., level 2) and, in block 54, an indication of this state can be output by the logic circuit 12, such as by outputting a binary word of "10".

If $I_{core}$ is greater than $I_{ref21/31}$, then a determination can be made that the read cell 38, 40 of the interrogated core memory device 6 is in a charged program state greater then the lowest charged program state and the method can proceed to block 56 where $I_{core}$ can be compared against a third reference current ($I_{ref31/41}$). The third reference current can be derived from dynamic reference devices 8 to be indicative of whether the read cell 38, 40 of the core memory device 6 is in the middle charged data state (e.g., level 3) or a higher charged program level (i.e., level 4). The third reference current, in the illustrated embodiment, is derived by averaging a reference current from at least one dynamic reference indicative of the minimum possible threshold voltage for a cell 38, 40 storing the middle charged program level and the minimum possible threshold voltage for a cell 38, 40 storing the highest charged program level.

The minimum possible threshold voltage for a cell 38, 40 storing the middle charged program level can be indicated by a dynamic reference device 8 for which the read cell 38, 40 stores charge corresponding to the middle charged program level (e.g., level 3) and the unread cell 38, 40 is uncharged or in the blank data state (e.g., level 1). The minimum possible threshold voltage for a cell 38, 40 storing the highest charged program level can be indicated by a dynamic reference device 8 for which the read cell 38, 40 stores charge corresponding to the highest charged program level (e.g., level 4) and the unread cell 38, 40 is uncharged or in the blank data state (e.g., level 1). Hence, the first reference current is illustrated by the shorthand notation of $I_{ref31/41}$.

If $I_{core}$ is less than $I_{ref31/41}$, then a determination can be made that the read cell 38, 40 of the interrogated core memory device 6 is in the middle charged program state (e.g., level 3) and, in block 58, an indication of this state can be output by the logic circuit 12, such as by outputting a binary word of "01".

If $I_{core}$ is greater than $I_{ref31/41}$, then a determination can be made that the read cell 38, 40 of the interrogated core memory device 6 is in the highest charged program state (e.g., level 4) and, in block 60, an indication of this state can be output by the logic circuit 12, such as by outputting a binary word of "00".

Once the data state of the interrogated charge storing cell 38, 40 is determined, the method of FIG. 5 can be repeated (possibly starting at clock 46) for another charge storing cell 38, 40 until each core memory device 6 of interest is fully read.

Erasing of the memory device 6 can be carried out using conventional techniques for erasing a charge trapping dielectric flash memory device. For example, a band-to-band (BTB) hot hole injection technique can be used to remove charge from the charge storing cells 38, 40.

As should be apparent, the programming technique of the present invention can be used to increase the density of data bits stored per unit area of an integrated circuit memory core. A single core memory device 6 can replace four or more conventional floating gate memory devices or can replace two or more conventional charge trapping dielectric flash memory devices. Accordingly, the power requirements, size and manufacturing costs of a core memory array 4 can be reduced using the core memory devices 6 programmed in accordance with the present invention.

Although particular embodiments of the invention have been described in detail, it is understood that the invention is not limited correspondingly in scope, but includes all changes, modifications and equivalents coming within the spirit and terms of the claims appended hereto.

For example, each of the charge storing cells 38, 40 can be programmed with greater resolution (e.g., additional program levels) such that each charge storing cell can store three or more bits of data.

What is claimed is:

1. A method of programming and subsequently reading a charge trapping dielectric memory device having a first charge storing cell adjacent a first conductive region and a second charge storing cell adjacent a second conductive region, comprising:
   programming the memory device, including:
      programming the first charge storing cell to store a first amount of charge, the first amount of charge corresponding to a first cell data state selected from a blank program level or one of a plurality of charged program levels; and
      programming the second charge storing cell to store a second amount of charge, the second amount of charge corresponding to a second cell data state selected from the blank program level or one of the plurality of charged program levels; and reading one of the charge storing cells, including:
      comparing a first conductive region to second conductive region current against a plurality of reference currents to determine the data state to which the read charge storing cell is programmed, and
      wherein the reference currents include a first reference current derived from a maximum complimentary bit disturb threshold voltage condition of a first associated dynamic reference and a minimum lowest program level threshold voltage condition of a second associated dynamic reference.

2. The method according to claim 1, wherein each data state for one of the charge storing cells establishes a distinguishable threshold voltage for the memory device.

3. The method according to claim 1, wherein channel hot electron injection is used to program the charge storing cells to the charged program levels.

4. The method according to claim 1, wherein during programming of the first charge storing cell to one of the charged program levels, a bias potential is applied to the second conductive region.

5. The method according to claim 1, wherein during programming of the second charge storing cell to one of the charged program levels, a bias potential is applied to the first conductive region.

6. The method according to claim 1, wherein the plurality of charged program levels include a lowest program level, a middle program level and a highest program level.

7. The method according to claim 1, wherein deriving the first reference current includes averaging the maximum complimentary bit disturb threshold voltage condition and the minimum lowest program level threshold voltage condition.

8. The method according to claim 1, further comprising outputting a value corresponding to the blank program level if the first conductive region to second conductive region current is less than the first reference current.

9. The method according to claim 1, wherein the reference currents include a second reference current derived from the minimum lowest program level threshold voltage condition of the second associated dynamic reference and a minimum middle program level threshold voltage condition of the third associated dynamic reference and a third reference current derived from the minimum middle program level threshold voltage condition of the third associated dynamic reference and a minimum highest program level threshold voltage condition of a fourth associated dynamic reference.

10. The method according to claim 9, wherein deriving the second reference current includes averaging the minimum lowest program level threshold voltage condition and the minimum middle program level threshold voltage condition and deriving the third reference current includes averaging the minimum middle program level threshold voltage condition and the minimum highest program level threshold voltage condition.

11. The method according to claim 9, wherein the first and fourth dynamic references are implemented by reading a single dynamic reference in opposite directions.

12. The method according to claim 1, wherein the reading is conducted by a reverse read operation wherein a voltage is applied to the conductive region adjacent the unread charge storing cell.

13. A method of programming and subsequently reading a charge trapping dielectric memory device having a first charge storing cell adjacent a first conductive region and a second charge storing cell adjacent a second conductive region, comprising:
   programming the memory device, including:
      programming the first charge storing cell to store a first amount of charge, the first amount of charge corresponding to a first cell data state selected from a blank program level or one of a plurality of charged program levels; and
      programming the second charge storing cell to store a second amount of charge, the second amount of charge corresponding to a second cell data state selected from the blank program level or one of the plurality of charged program levels; and
   reading one of the charge storing cells, including:
      comparing a first conductive region to second conductive region current against a plurality of reference currents to determine the data state to which the read charge storing cell is programmed, and outputting a first digital word value associated with the determined data state for the read charge storing cell, the first digital word being at least two bits in length.

14. The method according to claim 13, further comprising reading the other of the charge storing cells and outputting a second digital word value associated with the data state for the other of the charge storing cell, the second digital word being at least two bits in length.

15. A method of reading a charge trapping dielectric memory device having a first charge storing cell adjacent a first conductive region and a second charge storing cell adjacent a second conductive region, and wherein each charge storing cell is independently programmed to a program level selected from a blank program level or one of a plurality of charged program levels, comprising:

generating a plurality of reference currents including a first reference current derived from a maximum complimentary bit disturb threshold voltage condition of a first dynamic reference associated with the memory device and a minimum lowest program level threshold voltage condition of a second dynamic reference associated with the memory device; and comparing a current through a channel interposed between the first and second conductive regions against the plurality of reference currents to determine the program level to which a read one of the charge storing cells is programmed.

16. The method according to claim 15, wherein the charge storing cells are located in a continuous dielectric charge storing layer and the channel is control by a single gate electrode.

17. The method according to claim 15, further comprising outputting a data value corresponding to the program level of the read charge storing cells.

18. The method according to claim 17, wherein the data value is a digital word of at least two bits.

19. The method according to claim 15, wherein deriving the first reference current includes averaging the maximum complimentary bit disturb threshold voltage condition and the minimum lowest program level threshold voltage condition.

20. The method according to claim 15, further comprising outputting a value corresponding to the blank program level if the current through the channel is less than the first reference current.

* * * * *